US012052886B2

(12) United States Patent
Kim et al.

(10) Patent No.: US 12,052,886 B2
(45) Date of Patent: Jul. 30, 2024

(54) DISPLAY APPARATUS HAVING A REFRACTIVE LAYER

(71) Applicant: SAMSUNG DISPLAY CO., LTD., Yongin-si (KR)

(72) Inventors: Kihyun Kim, Yongin-si (KR); Younggil Park, Yongin-si (KR); Hyunsu Son, Yongin-si (KR); Huiyeon Choe, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/176,468

(22) Filed: Feb. 28, 2023

(65) Prior Publication Data

US 2023/0209879 A1 Jun. 29, 2023

Related U.S. Application Data

(63) Continuation of application No. 17/231,574, filed on Apr. 15, 2021, now Pat. No. 11,605,802.

(30) Foreign Application Priority Data

Jul. 3, 2020 (KR) .................. 10-2020-0082262

(51) Int. Cl.
*H10K 50/84* (2023.01)
*H10K 50/80* (2023.01)
(Continued)

(52) U.S. Cl.
CPC ......... *H10K 50/858* (2023.02); *H10K 50/844* (2023.02); *H10K 50/868* (2023.02);
(Continued)

(58) Field of Classification Search
CPC .. H10K 50/858; H10K 50/844; H10K 50/868; H10K 50/816; H10K 50/818;
(Continued)

(56) References Cited

U.S. PATENT DOCUMENTS 10,096,797 B2 * 10/2018 Choi .................. B32B 15/085
10,971,557 B2 * 4/2021 Jeong ................. G02B 5/0242
(Continued)

FOREIGN PATENT DOCUMENTS

KR 10-2010-0000779 1/2010
KR 10-2016-0007761 1/2016
(Continued)

*Primary Examiner* — Ida M Soward
(74) *Attorney, Agent, or Firm* — F. Chau & Associates, LLC

(57) ABSTRACT

A display apparatus includes a substrate, a pixel layer arranged over the substrate and including a plurality of display elements, an encapsulation member sealing the pixel layer, and a refractive layer arranged on the encapsulation layer and including a first refractive layer and a second refractive layer. The first refractive layer includes openings that correspond to the plurality of display elements, and the second refractive layer includes high refractive particles. The second refractive layer includes a first layer and a second layer, the first layer includes the high refractive particles dispersed in a first concentration, and the second layer includes the high refractive particles dispersed in a second concentration different from the first concentration.

20 Claims, 16 Drawing Sheets

(51) Int. Cl.
    *H10K 50/844*     (2023.01)
    *H10K 50/85*     (2023.01)
    *H10K 50/858*     (2023.01)
    *H10K 50/86*     (2023.01)
    *H10K 59/12*     (2023.01)
    *H10K 59/40*     (2023.01)
    *G06F 3/041*     (2006.01)
    *G06F 3/044*     (2006.01)
    *H01L 27/146*     (2006.01)
    *H10K 50/816*     (2023.01)
    *H10K 50/818*     (2023.01)
    *H10K 50/828*     (2023.01)
    *H10K 59/121*     (2023.01)
    *H10K 59/123*     (2023.01)
    *H10K 59/124*     (2023.01)
    *H10K 59/35*     (2023.01)
    *H10K 102/00*     (2023.01)

(52) U.S. Cl.
    CPC ............ *H10K 59/12* (2023.02); *H10K 59/40* (2023.02); *G06F 3/0412* (2013.01); *G06F 3/044* (2013.01); *G09G 2300/0408* (2013.01); *G09G 2300/0804* (2013.01); *H01L 27/14678* (2013.01); *H10K 50/816* (2023.02); *H10K 50/818* (2023.02); *H10K 50/828* (2023.02); *H10K 59/1216* (2023.02); *H10K 59/123* (2023.02); *H10K 59/124* (2023.02); *H10K 59/35* (2023.02); *H10K 59/351* (2023.02); *H10K 2102/00* (2023.02)

(58) Field of Classification Search
    CPC ...... H10K 50/828; H10K 50/84; H10K 50/85; H10K 50/86; H10K 50/8426; H10K 59/12; H10K 59/40; H10K 59/1216; H10K 59/123; H10K 59/124; H10K 59/35; H10K 59/351; H10K 59/122; H10K 2102/331; H01L 27/14678; G06F 3/0412; G06F 3/044; G09G 2300/0408
See application file for complete search history.

(56) References Cited

U.S. PATENT DOCUMENTS

| | | | |
|---|---|---|---|
| 2005/0116625 A1 | 6/2005 | Park et al. | |
| 2010/0059778 A1 | 3/2010 | Shimizu et al. | |
| 2013/0183815 A1 | 6/2013 | Choi et al. | |
| 2014/0339509 A1 | 11/2014 | Choi et al. | |
| 2015/0255754 A1* | 9/2015 | Moon | H10K 59/877 257/89 |
| 2017/0154930 A1* | 6/2017 | Kim | H10K 59/38 |
| 2017/0155093 A1* | 6/2017 | Jo | H10K 50/84 |
| 2018/0341147 A1 | 11/2018 | Sugitani et al. | |
| 2019/0072818 A1 | 3/2019 | Jung et al. | |
| 2019/0121176 A1 | 4/2019 | Lee et al. | |
| 2019/0173056 A1* | 6/2019 | Bai | H10K 50/844 |
| 2019/0219875 A1* | 7/2019 | Jung | H10K 50/858 |
| 2019/0348470 A1 | 11/2019 | Song et al. | |
| 2020/0081292 A1* | 3/2020 | Park | H05B 33/10 |
| 2020/0210005 A1* | 7/2020 | Kim | G06F 3/0412 |
| 2020/0365833 A1* | 11/2020 | Joo | H10K 59/873 |
| 2021/0126056 A1* | 4/2021 | Kim | H10K 50/844 |
| 2021/0135141 A1* | 5/2021 | Park | H10K 50/82 |
| 2021/0176468 A1 | 6/2021 | Lee | |
| 2022/0006059 A1 | 1/2022 | Kim et al. | |

FOREIGN PATENT DOCUMENTS

| | | | |
|---|---|---|---|
| KR | 20170027374 A * | 3/2017 | ............ H10K 50/86 |
| KR | 10-2017-0051640 | 6/2017 | |
| KR | 10-1901832 | 9/2018 | |
| KR | 10-2048924 | 11/2019 | |
| TW | 201327799 A * | 7/2013 | ......... H01L 51/5275 |

* cited by examiner

DISPLAY APPARATUS HAVING A REFRACTIVE LAYER

CROSS-REFERENCE TO RELATED APPLICATION

This application is a Continuation of co-pending U.S. patent application Ser. No. 17/231,574, filed on Apr. 15, 2021, which claims priority under 35 U.S.C. § 119 to Korean Patent Application No. 10-2020-0082262, filed on Jul. 3, 2020, in the Korean Intellectual Property Office, the disclosures of which are incorporated by reference herein in their entirety.

TECHNICAL FIELD

The present disclosure relates to a display apparatus, and more particularly, to a display apparatus having a refractive layer.

DISCUSSION OF THE RELATED ART

Today, display apparatuses are being manufactured to be larger and thinner so as to be more appealing and to better be accommodated by various electronic devices. It is desirable for display devices to provide accurate and clear colors while having a large size and a thin profile.

SUMMARY

A display apparatus includes a substrate, a pixel layer on the substrate and including a plurality of display elements, an encapsulation member sealing the pixel layer, and a refractive layer on the encapsulation member and including a first refractive layer and a second refractive layer. The first refractive layer includes openings that correspond to the plurality of display elements. The second refractive layer includes high refractive particles. The second refractive layer includes a first layer and a second layer. The first layer includes the high refractive particles dispersed in a first concentration. The second layer includes the high refractive particles dispersed in a second concentration different from the first concentration.

The second concentration may be greater than the first concentration.

The first concentration may be about 50 wt % to about 70 wt %.

The second concentration may be about 80 wt % to about 90 wt %.

The second refractive layer may at least partially cover the first refractive layer.

An average diameter of the high refractive particles may be about 5 nm to about 30 nm.

A thickness of the second layer may be about 0.5 μm to about 1 μm.

The second refractive layer may have a refractive index greater than that of the first refractive layer.

A refractive index of the first refractive layer may be about 1.3 to about 1.5.

A refractive index of the second refractive layer may be about 1.6 to about 1.9.

The second refractive layer may be arranged through an inkjet process or a deposition process.

An inner wall of each of the openings may include an inclined surface.

A thickness of the first refractive layer may be about 1.5 μm to about 2.5 μm.

The display apparatus may further include an input sensing layer arranged between the encapsulation member and the refractive layer and including at least one conductive layer and an insulating layer, the at least one conductive layer including a sensing electrode or a trace line.

The first refractive layer may at least partially overlap the at least one conductive layer of the input sensing layer.

The display apparatus may further include a polarizing layer arranged on the refractive layer.

A display apparatus includes a display element configured to emit light, a refractive layer on the display element and including a first refractive layer and a second refractive layer, the first refractive layer including an opening that corresponds to the display element, and the second refractive layer having a refractive index different from that of the first refractive layer, and a polarizing layer arranged on the refractive layer. The second refractive layer includes a first layer and a second layer. The first layer includes high refractive particles dispersed at a first concentration. The second layer includes high refractive particles dispersed at a second concentration different from the first concentration. A portion of light emitted from the display element is totally reflected by an interface between an inner wall of the opening and the second refractive layer and thus a light path is changed.

The display element may include a pixel electrode, an intermediate layer, and an opposite electrode, the intermediate layer being on the pixel electrode and including an emission layer, and the opposite electrode being on the intermediate layer, and the first refractive layer may at least partially overlap a pixel-defining layer that covers edges of the pixel electrode.

The display apparatus may further include an encapsulation member arranged between the display element and the refractive layer.

The display apparatus may further include an input sensing layer arranged between the encapsulation member and the refractive layer and including at least one conductive layer and an insulating layer. The at least one conductive layer may include a sensing electrode or a trace line.

The first refractive layer may at least partially overlap the at least one conductive layer of the input sensing layer.

The second concentration may be greater than the first concentration.

The first concentration may be about 50 wt % to about 70 wt %.

The second concentration may be about 80 wt % to about 90 wt %.

An average diameter of the high refractive particles may be about 5 nm to about 30 nm.

A thickness of the second layer may be about 0.5 μm to about 1 μm.

A refractive index of the first refractive layer may be about 1.3 to about 1.6.

A refractive index of the second refractive layer may be about 1.6 to about 1.9.

The second refractive layer may be arranged through an inkjet process or a deposition process.

A thickness of the first refractive layer may be about 1.5 μm to about 2.5 μm.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
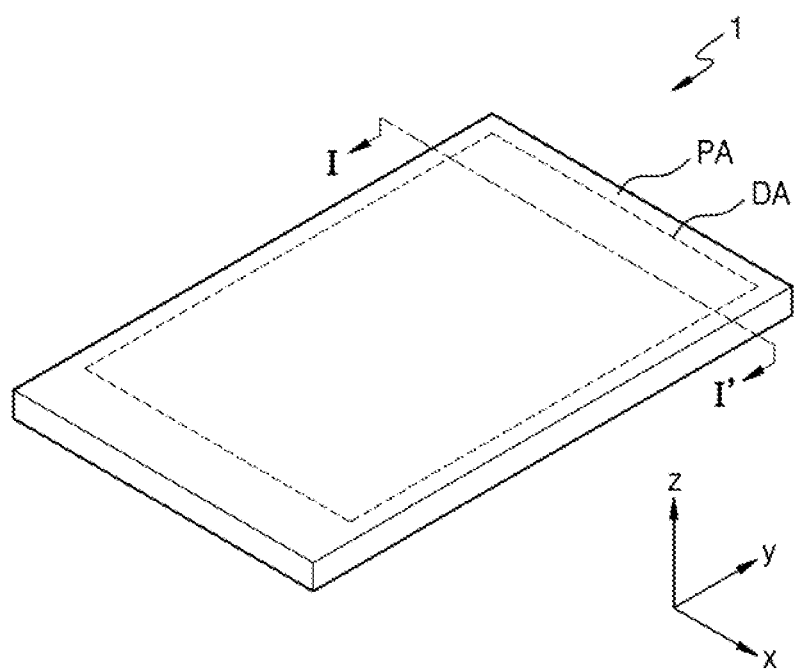
FIG. 1 is a perspective view illustrating a display apparatus according to an exemplary embodiment of the present disclosure.

Reference will now be made in detail to various exemplary embodiments of the present disclosure, which are illustrated in the accompanying drawings. In the present disclosure and the accompanying drawings, like reference numerals may refer to like elements. In this regard, the described exemplary embodiments may have different forms and should not necessarily be construed as being limited to the descriptions set forth herein. As used herein, the term "and/or" includes any and all combinations of one or more of the associated listed items.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. For example, for example, intervening layers, regions, or elements may be present.

Sizes of elements in the drawings may be exaggerated for convenience of explanation.

In the present specification, "A and/or B" means A or B, or A and B. In the present specification, "at least one of A and B" means A or B, or A and B.

As used herein, when a wiring is referred to as "extending in a first direction or a second direction", it means that the wiring not only extends in a straight line shape but also extends in a zigzag or in a curve in the first direction or the second direction.

Hereinafter, embodiments will be described in detail with reference to the accompanying drawings. The same reference numerals may be used to denote the same or similar elements.

FIG. 1 is a perspective view illustrating a display apparatus according to an exemplary embodiment of the present disclosure.

Referring to FIG. 1, the display apparatus 1, according to an exemplary embodiment of the present disclosure, may include a display area DA and a peripheral area PA. The peripheral area PA may be arranged outside of the display area DA and may at least partially surround the display area DA. Various wirings and a driving circuit may be arranged in the peripheral area PA, the various wirings and the driving circuit transferring an electric signal to be applied to the display area DA. The display apparatus 1 may display a particular image using light emitted from a plurality of pixels arranged in the display area DA. The display apparatus 1 may be able to be bent without sustaining damage thereto and the display apparatus 1 may be bent in a partial region of the peripheral area PA, the partial region including a bent area.

The display apparatus 1 may include display apparatuses such as organic light-emitting displays, inorganic light-emitting displays, and quantum-dot light-emitting displays. Hereinafter, an organic light-emitting display apparatus is described as an example. The display apparatus 1 may be incorporated into various electronic apparatuses such as mobile phones, smartphones, notebook/laptop computers, and smartwatches.

Figure 2:
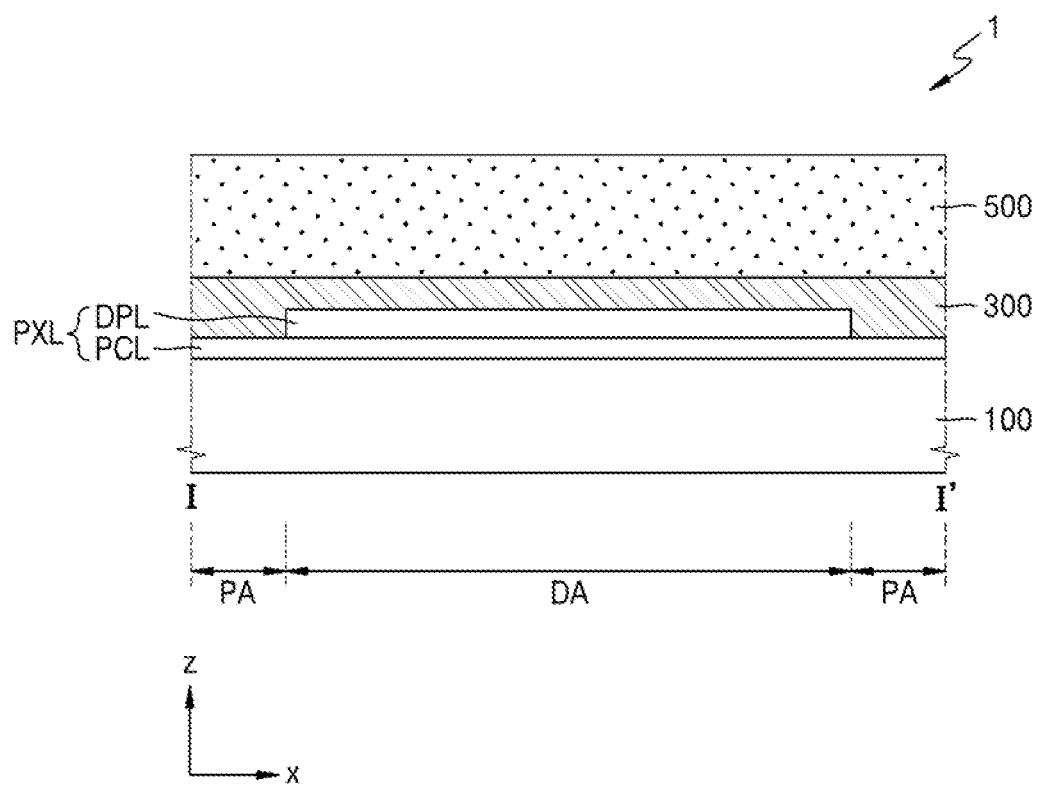
FIG. 2 is a cross-sectional view illustrating a display apparatus according to an exemplary embodiment of the present disclosure.

FIG. 2 is a cross-sectional view illustrating the display apparatus 1 according to an exemplary embodiment of the present disclosure. In an exemplary embodiment of the present disclosure, FIG. 2 corresponds to a cross-sectional view illustrating the display apparatus 1, taken along line I-I' of FIG. 1.

Referring to FIG. 2, the display apparatus 1 may include a substrate 100, a pixel layer PXL, an encapsulation member 300, and a refractive layer 500 that are sequentially stacked in a thickness direction (a z-direction). The pixel layer PXL is disposed on the substrate 100. The encapsulation member 300 seals the pixel layer PXL. The refractive layer 500 is disposed on the encapsulation member 300.

The substrate 100 may include glass or a polymer resin. According to an exemplary embodiment of the present disclosure, the substrate 100 may include glass having $SiO_2$ as a main component, or include various flexible or bendable materials, for example, a resin such as a reinforced plastic. The substrate 100 may be bent in a partial region of the peripheral area PA, for example, the substrate 100 may be bent in a bending area.

The pixel layer PXL may be arranged on the substrate 100. The pixel layer PXL may include a display element layer DPL and a pixel circuit layer PCL. The display element layer DPL may include display elements arranged for each pixel. The pixel circuit layer PCL may include a pixel circuit arranged for each pixel and insulating layers. The display element layer DPL may be arranged on the pixel circuit layer PCL. A plurality of insulating layers may be arranged between a pixel circuit and a display element. Some wirings of the pixel circuit layer PCL and the insulating layers may extend to the peripheral area PA.

The encapsulation member 300 may include a thin-film encapsulation layer. The thin-film encapsulation layer may include at least one inorganic encapsulation layer and at least one organic encapsulation layer. In the case where the display apparatus 1 includes the substrate including a polymer resin and the encapsulation member 300 of a thin-film encapsulation layer including an inorganic encapsulation layer and an organic encapsulation layer, the display apparatus 1 may be made more flexible.

The refractive layer 500 may adjust the path of light emitted from the display elements of the display element layer DPL and increase a light-emitting efficiency of the display apparatus 1. As described below, the refractive layer 500 may increase a light-extraction efficiency of the display apparatus 1 by changing the path of light emitted from the display elements.

Figure 3:
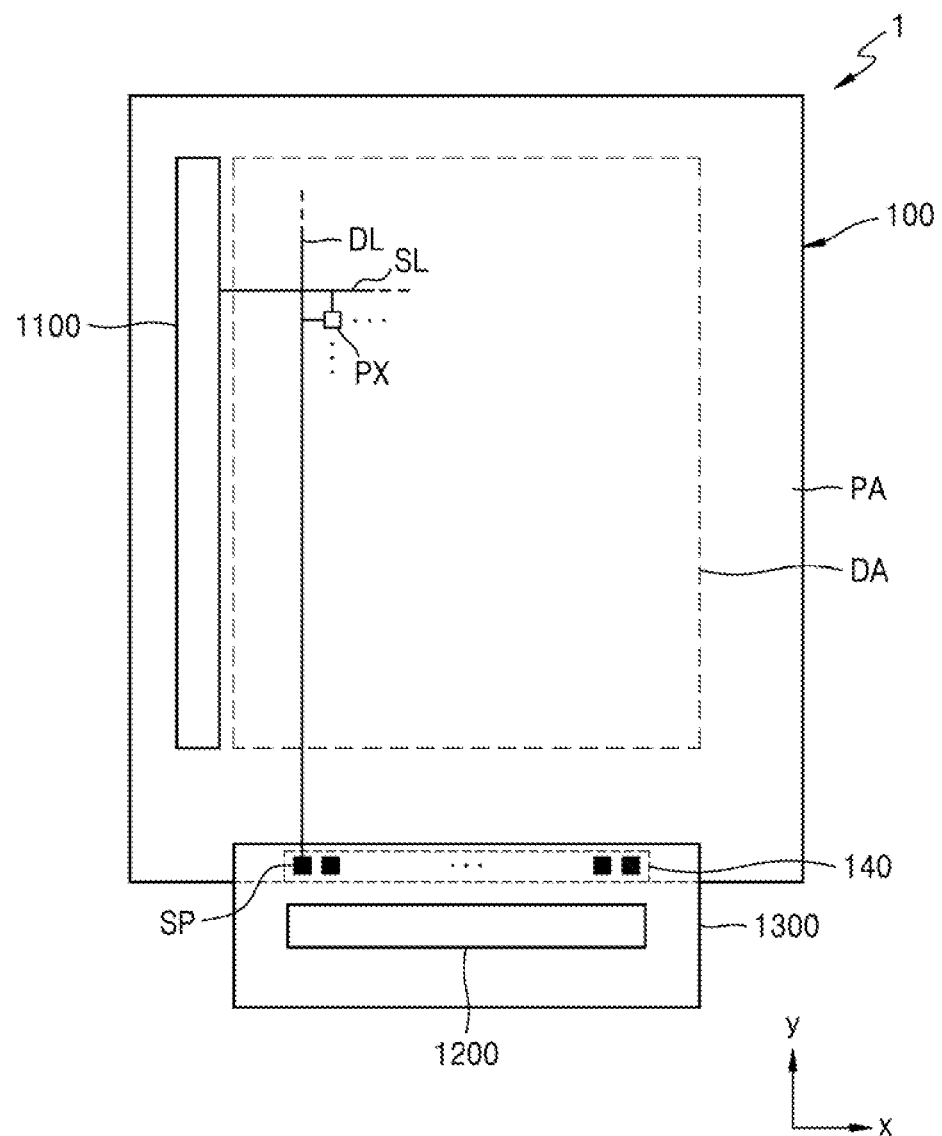
FIG. 3 is a plan view illustrating a display apparatus according to an exemplary embodiment of the present disclosure.

FIG. 3 is a plan view illustrating the display apparatus 1 according to an exemplary embodiment of the present disclosure.

Referring to FIG. 3, the substrate 100 may include the display area DA and the peripheral area PA. The peripheral area PA may be arranged outside of the display area DA and may at least partially surround the display area DA.

A plurality of pixels PX may be provided in the display area DA of the substrate 100. The plurality of pixels PX may be arranged in a particular pattern in a first direction (an x-direction, a row direction) and a second direction (a y-direction, a column direction).

A scan driver 1100, a data driver 1200, and main power wirings may be arranged in the peripheral area PA of the substrate 100. The scan driver 1100 may provide a scan signal to each pixel PX. The data driver 1200 may provide a data signal to each pixel PX. The main power wirings may provide a first power voltage ELVDD (also referred to as a driving voltage) (see FIGS. 4 and 5) and a second power voltage ELVSS (also referred to as a common voltage) (see FIGS. 4 and 5). A pad portion 140 may be arranged in the peripheral area PA of the substrate 100. A plurality of signal pads SP may be connected to a data line DL arranged in the pad portion 140.

The scan driver 1100 may include an oxide semiconductor TFT gate driver circuit (OSG) or an amorphous silicon TFT gate driver circuit (ASG). The scan driver 1100 may be adjacent to one side of the substrate 100 or scan drivers 1100 may respectively be adjacent to two sides of the substrate 100 facing each other in an exemplary embodiment of the present disclosure.

FIG. 3 shows a chip-on-film (COF) method in which the data driver 1200 is arranged on a film 1300 electrically connected to the signal pads SP arranged over the substrate 100. According to an exemplary embodiment of the present disclosure, the data driver 1200 may be directly arranged on the substrate 100 through a chip-on-glass (COG) method or a chip-on-plastic (COP) method. The data driver 1200 may be electrically connected to a flexible printed circuit board (FPCB).

Figure 4:
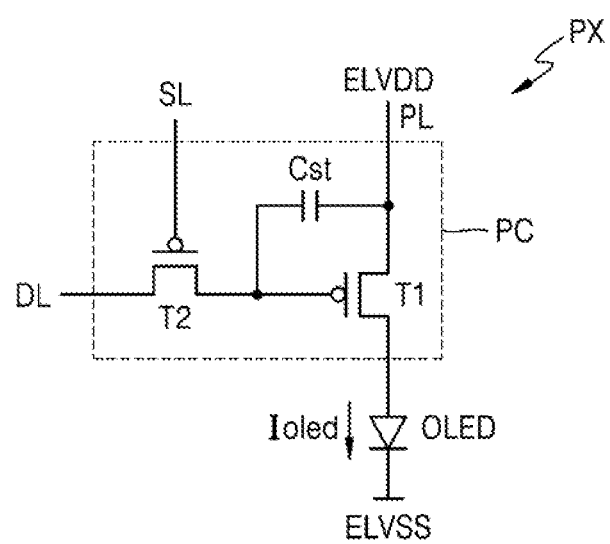
FIGS. 4 and 5 are equivalent circuit diagrams of a pixel that may be included in a display apparatus according to an exemplary embodiment of the present disclosure.

Referring to FIG. 4, the pixel PX includes a pixel circuit PC and a display element, the pixel circuit PC being connected to a scan line SL and a data line DL, and the display element being connected to the pixel circuit PC. The pixel circuit PC may include at least one thin film transistor and a storage capacitor. The display element may include an organic light-emitting diode OLED.

The pixel circuit PC may include a first thin film transistor T1, a second thin film transistor T2, and a storage capacitor Cst. Each pixel PX may emit, for example, red, green, blue, or white light from an organic light-emitting diode OLED. The first thin film transistor T1 and the second thin film transistor T2 may each be a transistor.

The second thin film transistor T2 may be a switching transistor and may be connected to the scan line SL and the data line DL. The second thin film transistor T2 may transfer a data signal input from the data line DL to the first thin film transistor T1 according to a scan signal input from the scan line SL. The storage capacitor Cst may be connected to the second thin film transistor T2 and may a power voltage line PL and may store a voltage corresponding to a difference between a voltage corresponding to a data signal transferred from the second thin film transistor T2 and the first power voltage ELVDD supplied to the power voltage line PL.

The first thin film transistor T1 may include a driving thin film transistor and be connected to the power voltage line PL and the storage capacitor Cst. The first thin film transistor T1 may control a driving current $I_{oled}$ flowing from the power voltage line PL to the organic light-emitting diode OLED in response to the voltage stored in the storage capacitor Cst.

The organic light-emitting diode OLED may emit light having a particular brightness according to the driving current $I_{oled}$. The organic light-emitting diode OLED may include a pixel electrode, an opposite electrode, and an intermediate layer, the intermediate layer including an emission layer between the pixel electrode and the opposite electrode. The opposite electrode of the organic light-emitting diode OLED may receive the second power voltage ELVSS.

Though it is described in FIG. 4 that the pixel circuit PC includes two thin film transistors and one storage capacitor, the present invention is not necessarily limited thereto. The number of thin film transistors and the number of storage capacitors may be variously changed depending on the design of the pixel circuit PC.

Figure 5:
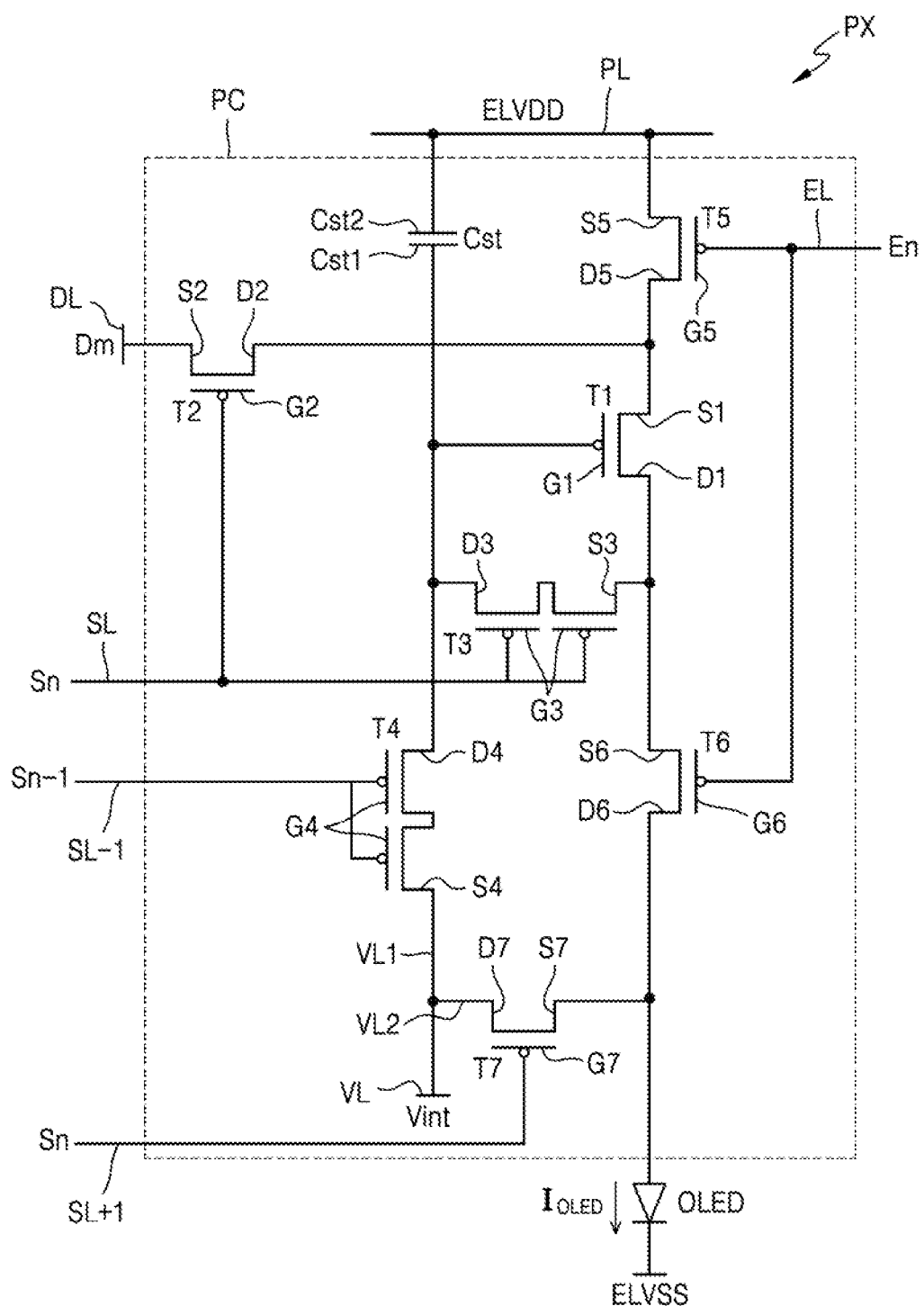

According to an exemplary embodiment of the present disclosure, referring to FIG. 5, a pixel PX may include the pixel circuit PC and the organic light-emitting diode OLED electrically connected to the pixel circuit PC.

As shown in FIG. 5, the pixel circuit PC may include a plurality of thin film transistors T1, T2, T3, T4, T5, T6, and T7 and the storage capacitor Cst. The plurality of thin film transistors T1, T2, T3, T4, T5, T6, and T7 and the storage capacitor Cst may be connected to signal lines SL, SL−1, SL+1, EL, and DL, a first initialization voltage line VL1, a second initialization voltage line VL2, and the driving voltage line PL.

The signal lines SL, SL−1, SL+1, EL, and DL may include the scan line SL, the previous scan line SL−1, the next scan line SL+1, the emission control line EL, and the data line DL, the scan line SL transferring a scan signal Sn, the previous scan line SL−1 transferring a previous scan signal Sn−1 to the first initialization thin film transistor T4, the next scan line SL+1 transferring a scan signal Sn to the second initialization thin film transistor T7, the emission control line EL transferring an emission control signal to the operation control thin film transistor T5 and the emission control thin film transistor T6, and the data line DL intersecting the scan line SL and transferring a data signal Dm. The driving voltage line PL may be configured to transfer the driving voltage ELVDD to the driving thin film transistor, the first initialization voltage line VL1 may be configured to transfer an initialization voltage Vint to the first initialization thin film transistor T4, and the second initialization voltage line VL2 may be configured to transfer the initialization voltage Vint to the second initialization thin film transistor T7.

A driving gate electrode G1 of the driving thin film transistor T1 is connected to a bottom electrode Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to a pixel electrode of the organic light-emitting diode OLED through the emission control thin film transistor T6. The driving thin film transistor T1 receives a data signal Dm depending on a switching operation of the switching thin film transistor T2 and supplies the driving current $I_{oled}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source region S1 of the driving thin film transistor T1 and is simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and is simultaneously connected to the pixel electrode of the organic light-emitting diode OLED through the emission control thin film transistor T6, and a compensation drain electrode D3 of the compensation thin film transistor T3 is connected to the bottom electrode Cst1 of the storage capacitor Cst, a first initialization drain electrode D4 of the first initialization thin film transistor T4, and the driving gate electrode G1 of the driving thin film transistor T1. The compensation thin film transistor T3 may be turned on in response to a scan signal Sn transferred through the scan line SL to diode-connect the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL−1, a first initialization source electrode S4 of the first initialization thin film transistor T4 is connected to the first initialization voltage line VL1, and a first initialization drain electrode D4 of the first initialization thin film transistor T4 is connected to the bottom electrode Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation of initializing a voltage of the gate electrode G1 of the driving thin film transistor T1 by transferring the initialization voltage Vint to the driving gate electrode G1 of the driving thin film transistor T1.

An operation control gate electrode G5 of the operation control thin-film transistor T5 is connected to the emission control line EL, an operation control source electrode S5 of the operation control thin-film transistor T5 is connected to the driving voltage line PL, and an operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL, the driving voltage ELVDD is transferred to the organic light-emitting diode OLED, and the driving current $I_{oled}$ flows through the organic light-emitting diode OLED.

A second initialization gate electrode G7 of the second initialization thin film transistor T7 is connected to the next scan line SL+1, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the second initialization voltage line VL2.

Since the scan line SL is electrically connected to the next scan line SL+1, the same scan signal Sn may be applied to the scan line SL and the next scan line SL+1. Therefore, the second initialization thin film transistor T7 may be turned on in response to a scan signal Sn transferred through the next scan line SL+1 and may perform an operation of initializing the pixel electrode of the organic light-emitting diode OLED.

A top electrode Cst2 of the storage capacitor Cst is connected to the driving voltage line PL, and a common electrode of the organic light-emitting diode OLED is connected to the common voltage ELVSS. Therefore, the organic light-emitting diode OLED may display an image by receiving the driving current $I_{oled}$ from the driving thin film transistor T1 and emitting light.

Though it is shown in FIG. 5 that the compensation thin film transistor T3 and the first initialization thin film transistor T4 each have a dual gate electrode, the compensation thin film transistor T3 and the first initialization thin film transistor T4 may have one gate electrode.

In addition, though FIG. 5 describes the structure of one pixel circuit PC, a plurality of pixels PX each having the same pixel circuit PC may be arranged to constitute a plurality of rows. In this case, the first initialization voltage line VL1, the previous scan line SL−1, the second initialization voltage line VL2, and the next scan line SL+1 may be shared by neighboring pixels.

According to an exemplary embodiment of the present disclosure, the first initialization voltage line VL1 and the previous scan line SL−1 may be electrically connected to a second initialization thin film transistor of another pixel circuit PC arranged in the second direction (the y-direction). Accordingly, a previous scan signal applied to the previous scan line SL−1 may be transferred as a next scan signal to the second initialization thin film transistor of the other pixel circuit PC. Likewise, the second initialization voltage line VL2 and the next scan line SL+1 may be electrically connected to a first initialization thin film transistor of another pixel circuit PC neighboring in the second direction (the y-direction) in the drawing to transfer a previous scan signal and an initialization voltage.

Figure 6:
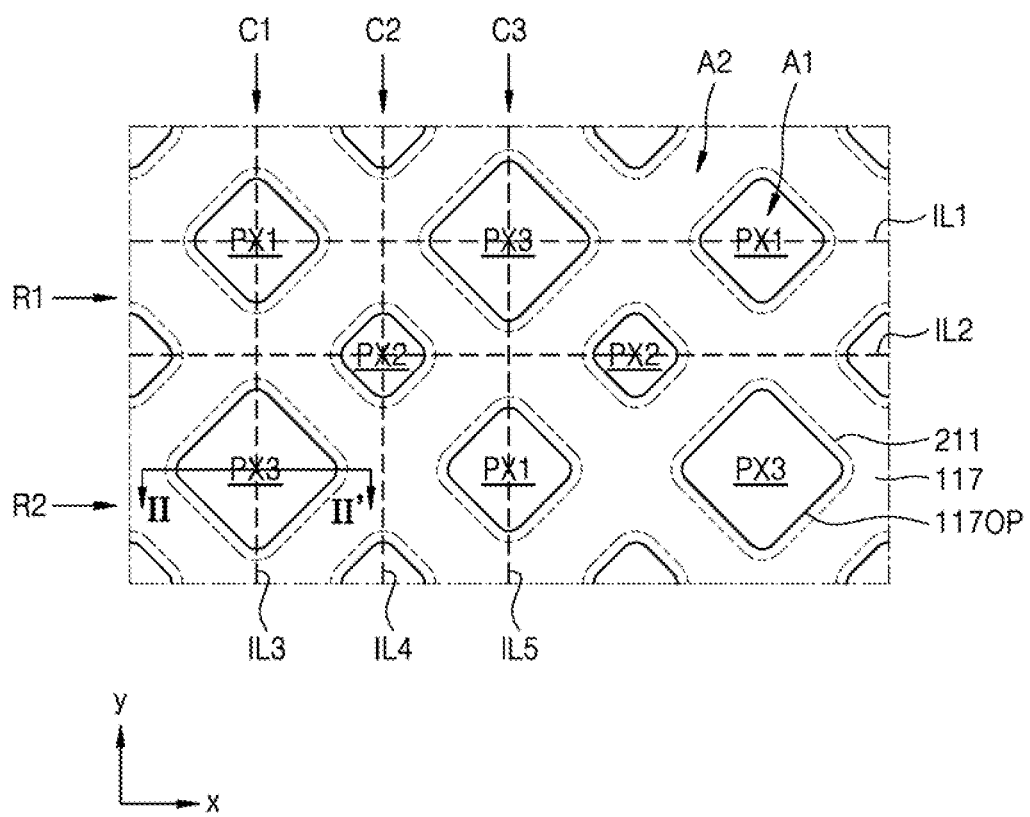
FIG. 6 is a plan view illustrating a display apparatus according to an exemplary embodiment of the present disclosure.
Figure 7:
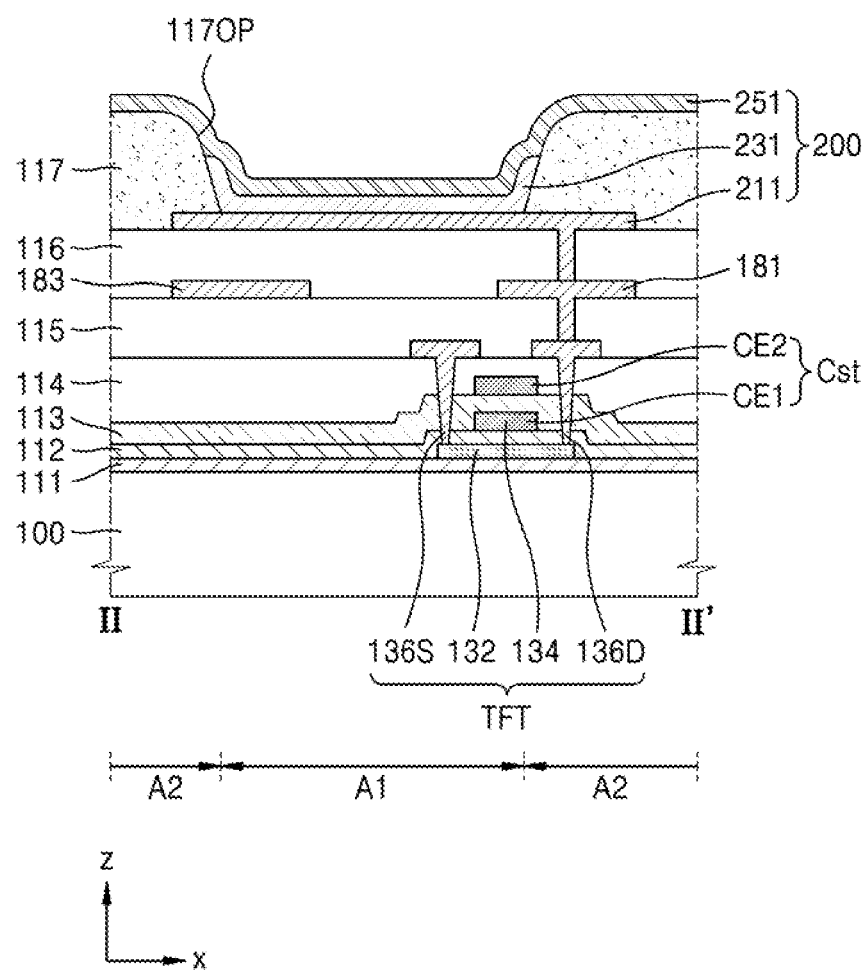
FIG. 7 is a cross-sectional view illustrating a display apparatus according to an exemplary embodiment of the present disclosure.

FIG. 6 is a plan view illustrating the display apparatus 1 according to an exemplary embodiment of the present disclosure, and FIG. 7 is a cross-sectional view illustrating the display apparatus 1 according to an exemplary embodiment of the present disclosure. FIG. 6 is a plan view illustrating an example of a pixel arrangement of the display apparatus 1, and FIG. 7 corresponds to a cross-sectional view illustrating the display apparatus 1, taken along line II-II' of FIG. 6.

Referring to FIGS. 6 and 7, the plurality of pixels may include a first pixel PX1, a second pixel PX2, and a third pixel PX3. The first pixel PX1, the second pixel PX2, and the third pixel PX3 may be repeatedly arranged in a column direction and a row direction according to a particular pattern. Each of the first pixel PX1, the second pixel PX2, and the third pixel PX3 may include a pixel circuit and an organic light-emitting diode OLED electrically connected to the pixel circuit. The organic light-emitting diode OLED of each pixel may be arranged right on the pixel circuit to at least partially overlap the pixel circuit or arranged to at least partially overlap a pixel circuit of a pixel on a row or a column that is offset from a pixel circuit and neighbors the pixel circuit. The arrangement of a pixel may include the arrangement of an organic light-emitting diode OLED of each of the first pixel PX1, the second pixel PX2, and the third pixel PX3, or the arrangement of a pixel electrode 211 constituting the organic light-emitting diode OLED.

On respective rows R1, R2, . . . , a pixel electrode 211 of the first pixel PX1, a pixel electrode 211 of the second pixel PX2, a pixel electrode 211 of the third pixel PX3, and a pixel electrode 211 of the second pixel PX2 may be spaced apart from each other and alternately arranged in zigzags. The pixel electrode 211 of the first pixel PX1 may be spaced apart from the pixel electrode 211 of the third pixel PX3 and alternately arranged on a first virtual straight line IL1 in the first direction (the x-direction). The pixel electrode 211 of the second pixel PX2 may be offset from the pixel electrode 211 of the first pixel PX1 and the pixel electrode 211 of the third pixel PX3 in a direction between the first direction (the x-direction) and the second direction (the y-direction) and repeatedly arranged on a second virtual straight line IL2 in the first direction (the x-direction).

On a first column C1, the pixel electrode 211 of the first pixel PX1 may be spaced apart from the pixel electrode 211 of the third pixel PX3 and alternately arranged on a third virtual straight line IL3 in the second direction (the y-direction). On a second column C2 neighboring the first column C1, the pixel electrodes 211 of the second pixel PX2 may be spaced apart from each other and repeatedly arranged on a fourth virtual straight line IL4 in the second direction (the y-direction). On a third column C3 neighboring the second column C2, opposite to the first column C1, the pixel electrode 211 of the third pixel PX3 may be spaced apart from the pixel electrode 211 of the first pixel PX1 and alternately arranged on a fifth virtual straight line IL5 in the second direction (the y-direction).

The pixel electrode 211 of the first pixel PX1, the pixel electrode 211 of the second pixel PX2, and the pixel electrode 211 of the third pixel PX3 may respectively have different sizes. In an exemplary embodiment of the present disclosure, the pixel electrode 211 of the third pixel PX3 may have a larger area than the pixel electrode 211 of the neighboring first pixel PX1. In addition, the pixel electrode 211 of the third pixel PX3 may have a larger area than the pixel electrode 211 of the neighboring second pixel PX2. The pixel electrode 211 of the first pixel PX1 may have a larger area than the pixel electrode 211 of the neighboring second pixel PX2. In an exemplary embodiment of the present disclosure, the pixel electrode 211 of the third pixel PX3 may have the same area as the pixel electrode 211 of the first pixel PX1. The pixel electrode 211 may have shapes including polygons such as quadrangles and octagons, circles, and ellipses. The polygons may include polygons having round vertexes.

In an exemplary embodiment of the present disclosure, the first pixel PX1 may include a red pixel that emits red light, the second pixel PX2 may include a green pixel that emits green light, and the third pixel PX3 may include a blue pixel that emits blue light. In an exemplary embodiment of the present disclosure, the first pixel PX1 may include a red pixel, the second pixel PX2 may include a blue pixel, and the third pixel PX3 may include a green pixel. Various modifications may be made.

The display area DA of the substrate 100 may include a first area A1 and a second area A2 at least partially surrounding the first area A1. The first area A1 may include a region in which the organic light-emitting diodes OLED of the first pixel PX1, the second pixel PX2, and the third pixel PX3 are arranged. The pixel electrode 211 is arranged in the first area A1. The area of the first area A1 may be less than the area of the pixel electrode 211. The second area A2 may include a region that surrounds the first area A1. The second area A2 may include a region arranged between a plurality of first areas A1. A pixel-defining layer 117 may be arranged in the second area A2. The first area A1 may correspond to a region of the pixel electrode 211 that is exposed by a first opening 117OP of the pixel-defining layer 117. The second area A2 may correspond to a region in which the pixel-defining layer 117 is arranged between the pixel electrodes 211. Accordingly, the first area A1 and the second area A2 of the substrate 100 may be respectively understood as the first area A1 and the second area A2 of the pixel PX. As described herein, the first area A1 may be defined as a region corresponding to a bottom surface of the first opening 117OP having a minimum area in a top view illustrating the first opening 117OP. In FIG. 6, the outline of the bottom surface of the first opening 117OP is shown by a solid line, and the outline of the pixel electrode 211 is shown by a dashed line.

Referring to FIG. 7, a buffer layer 111 may be arranged on the substrate 100, the buffer layer 111 being formed to prevent impurities from penetrating into a semiconductor layer of a thin film transistor.

The substrate 100 may include various materials such as glass, metal, and/or plastic. In an exemplary embodiment of the present disclosure, the substrate 100 may include a flexible substrate and may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The buffer layer 111 may include an inorganic insulating material such as silicon nitride or silicon oxide and may include a single layer or a multi-layer. A barrier layer may be further arranged between the substrate 100 and the buffer layer 111. The barrier layer may prevent or reduce the penetration of impurities from the substrate 100, etc. into the semiconductor layer. The barrier layer may include an inorganic material such as an oxide or a nitride, an organic material, or an organic/inorganic composite material and may include a single-layered structure or a multi-layered structure including an inorganic material and an organic material.

A thin film transistor TFT, a storage capacitor Cst, and an organic light-emitting diode 200 may be arranged over the substrate 100, the organic light-emitting diode 200 being electrically connected to the thin film transistor TFT. The electrical connection of the organic light-emitting diode 200 to the thin film transistor TFT may be understood as an electrical connection of the pixel electrode 211 to the thin film transistor TFT. The thin film transistor TFT may include the driving thin film transistor T1 of FIGS. 4 and 5.

The thin film transistor TFT may include a semiconductor layer 132, a gate electrode 134, a source electrode 136S, and a drain electrode 136D. The semiconductor layer 132 may include an oxide semiconductor material. The semiconductor layer 132 may include amorphous silicon, polycrystalline silicon, or an organic semiconductor material. The gate electrode 134 may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may include a single layer or a multi-layer by taking into account adhesion with a neighboring layer, surface flatness of a stacked layer, and processability.

A first insulating layer 112 may be arranged between the semiconductor layer 132 and the gate electrode 134, the first insulating layer 112 including an inorganic material such as silicon oxide, silicon nitride, and/or silicon oxynitride. A second insulating layer 113 and a third insulating layer 114 may be arranged between the gate electrode 134, and the source electrode 136S and the drain electrode 136D, the second insulating layer 113 and the third insulating layer 114 each including an inorganic material such as silicon oxide, silicon nitride, and/or silicon oxynitride. The source electrode 136S and the drain electrode 136D may be electrically connected to the semiconductor layer 132 through contact holes formed in the second insulating layer 113 and the third insulating layer 114.

The source electrode 136S and the drain electrode 136D may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may include a single layer or a multi-layer. According to an exemplary embodiment of the present disclosure, the source electrode 136S and the drain electrode 136D may have a multi-layered structure of Ti/Al/Ti.

The storage capacitor Cst may include a first electrode CE1 and a second electrode CE2 overlapping each other with the second insulating layer 113 disposed therebetween. The storage capacitor Cst may at least partially overlap the thin film transistor TFT. It is shown in FIG. 7 that the gate electrode 134 of the thin film transistor TFT serves as the first electrode CE1 of the storage capacitor Cst. In an exemplary embodiment of the present disclosure, the storage capacitor Cst might not overlap the thin film transistor TFT. For example, the first electrode CE1 of the storage capacitor Cst may be arranged on the first insulating layer 112 as a separate element from the gate electrode 134 of the thin film transistor TFT. The storage capacitor Cst may be covered by the third insulating layer 114.

The pixel circuit including the thin film transistor TFT and the storage capacitor Cst may be covered by a first planarization layer 115 and a second planarization layer 116. The first planarization layer 115 and the second planarization layer 116 serve as planarization insulating layers and may include organic insulating layers. The first planarization layer 115 and the second planarization layer 116 may include a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment of the present disclosure, the first planarization layer 115 and the second planarization layer 116 may include polyimide.

A display element, for example, an organic light-emitting diode 200 may be arranged on the second planarization layer 116. The organic light-emitting diode 200 may include a pixel electrode 211, an intermediate layer 231, and an opposite electrode 251.

The pixel electrode 211 may be arranged on the second planarization layer 116 and connected to the thin film transistor TFT through a connection electrode 181 on the first planarization layer 115. A wiring 183 such as the data line DL and the driving voltage line PL may be arranged on the first planarization layer 115.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the present disclosure, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an exemplary embodiment of the present disclosure, the pixel electrode 211 may further include a layer including ITO, IZO, ZnO, or $In_2O_3$ on/under the reflective layer. According to an exemplary embodiment of the present disclosure, the pixel electrode 211 may have a structure of ITO/Ag/ITO that are stacked.

A pixel-defining layer 117 may be arranged on the second planarization layer 116. The pixel-defining layer 117 may at least partially cover the edges of the pixel electrode 211 and define a pixel by including a first opening 117OP that exposes a portion of the pixel electrode 211. The first opening 117OP may correspond to the first area A1 of FIG. 6. The pixel-defining layer 117 may prevent arching, etc. from occurring at the edges of the pixel electrode 211 by increasing a distance between the edges of the pixel electrode 211 and the opposite electrode 251. The pixel-defining layer 117 may include an organic material such as polyimide (PI) or hexamethyldisiloxane (HMDSO).

The intermediate layer 231 may include an emission layer. The emission layer may include a polymer organic material or a low molecular weight organic material that emits light having a particular color. In an exemplary embodiment of the present disclosure, the intermediate layer 231 may include a first functional layer under the emission layer and/or a second functional layer on the emission layer. The first functional layer and/or the second functional layer may include a layer which is one body over a plurality of pixel electrodes 211, or may include a layer patterned to respectively correspond to the plurality of pixel electrodes 211.

The first functional layer may include a single layer or a multi-layer. According to an exemplary embodiment of the present disclosure, in the case where the first functional layer includes a polymer organic material, the first functional layer may include a hole transport layer (HTL), which has a single-layered structure, and may include poly(3,4-ethylenedioxythiophene) (PEDOT) or polyaniline (PAM). In the case where the first functional layer includes a low molecular weight organic material, the first functional layer may include a hole injection layer (HIL) and a hole transport layer (HTL).

The second functional layer may be omitted. According to an exemplary embodiment of the present disclosure, in the case where the first functional layer and the emission layer include a polymer organic material, the second functional layer may be preferably formed to support the characteristics of the organic light-emitting diode. The second functional layer may include a single layer or a multi-layer. The second functional layer may include an electron transport layer (ETL) and/or an electron injection layer (EIL).

The opposite electrode 251 may face the pixel electrode 211 with the intermediate layer 231 therebetween. The opposite electrode 251 may include a conductive material having a low work function. According to an exemplary embodiment of the present disclosure, the opposite electrode 251 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 251 may further include a layer on the (semi) transparent layer including the above-mentioned material, the layer including ITO, IZO, ZnO, or $In_2O_3$.

The opposite electrode 251 may be arranged on the intermediate layer 231 and the pixel-defining layer 117. The opposite electrode 251 may be formed as one body over a plurality of organic light-emitting diodes 200 in the display area DA to face the plurality of pixel electrodes 211.

Figure 8:
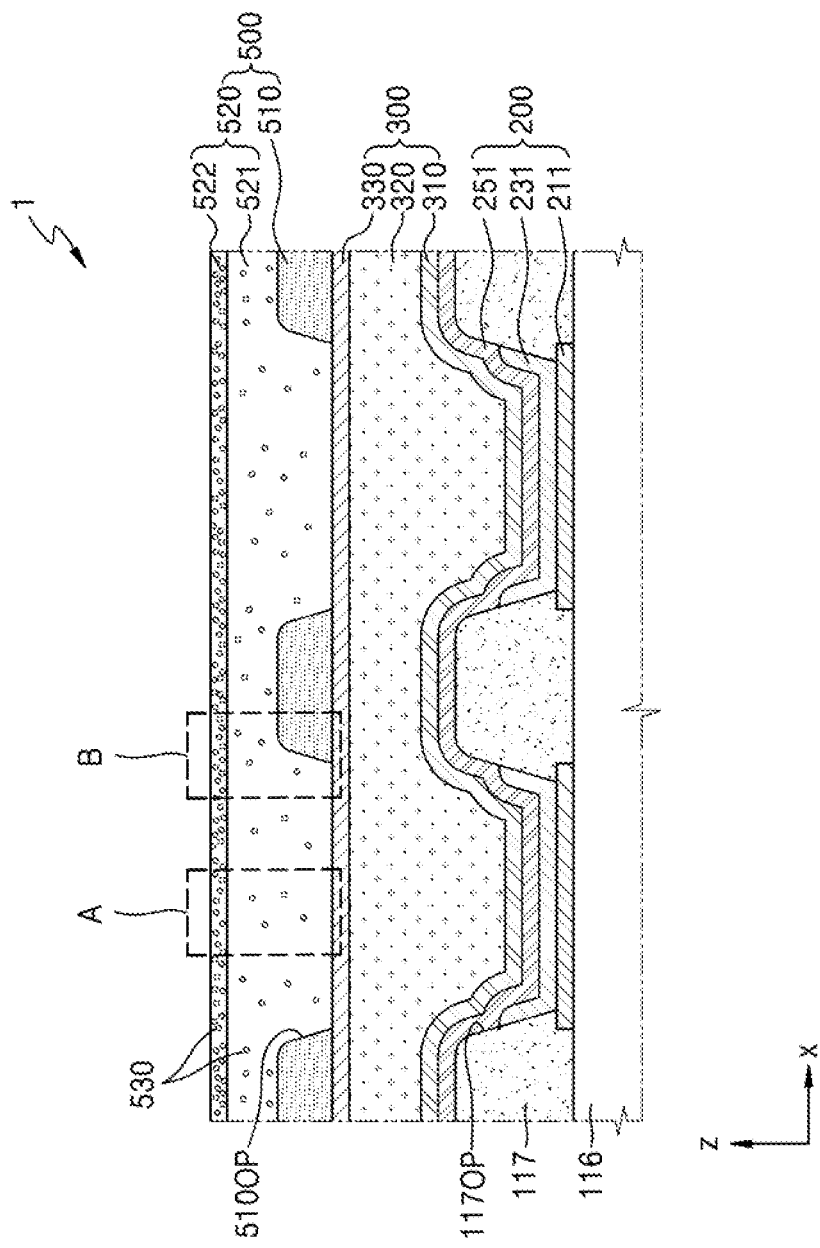
FIG. 8 is a cross-sectional view illustrating a display apparatus according to an exemplary embodiment of the present disclosure.

FIG. 8 is a cross-sectional view illustrating the display apparatus 1 according to an exemplary embodiment of the present disclosure.

Referring to FIG. 8, a thin-film encapsulation layer may be arranged as the encapsulation member 300 on the opposite electrode 251. The thin-film encapsulation layer may protect the organic light-emitting diode 200 from external moisture or oxygen, etc. The thin-film encapsulation layer may have a multi-layered structure. The thin-film encapsulation layer may include a first inorganic encapsulation layer 310, an organic encapsulation layer 320, and a second inorganic encapsulation layer 330. Since the thin-film encapsulation layer has a multi-layered structure, even when cracks occur inside the thin-film encapsulation layer, the cracks might not be connected between the first inorganic encapsulation layer 310 and the organic encapsulation layer 320 or between the organic encapsulation layer 320 and the second inorganic encapsulation layer 330. With this configuration, forming of a path through which external moisture or oxygen penetrates into the display area DA may be prevented or reduced. In an exemplary embodiment of the present disclosure, the number of organic encapsulation layers, the number of inorganic encapsulation layers, and a stacking order may be changed.

The first inorganic encapsulation layer 310 may at least partially cover the opposite electrode 251 and may include at least one inorganic insulating layer among aluminum oxide, titanium oxide, tantalum oxide, hafnium oxide, zinc oxide, silicon oxide, silicon nitride, and silicon oxynitride. Since the first inorganic encapsulation layer 310 is formed along a structure thereunder, a top surface of the first inorganic encapsulation layer 310 might not be flat.

The organic encapsulation layer 320 may at least partially cover the first inorganic encapsulation layer 310 and may have a thickness sufficient to block impurities. The top surface of the organic encapsulation layer 320 may be substantially flat over the entire display area DA. The organic encapsulation layer 320 may include polyethylene terephthalate, polyethylene naphthalate, polycarbonate, polyimide, polyethylene sulfonate, polyoxymethylene, polyarylate, hexamethyldisiloxane, an acrylic resin (e.g. polymethylmethacrylate, poly acrylic acid, etc.), or an arbitrary combination thereof.

The second inorganic encapsulation layer 330 may at least partially cover the organic encapsulation layer 320 and may include an inorganic insulating layer such as aluminum oxide, titanium oxide, tantalum oxide, hafnium oxide, zinc oxide, silicon oxide, silicon nitride, and/or silicon oxynitride. The second inorganic encapsulation layer 330 may prevent the organic encapsulation layer 320 from being exposed to the outside by extending to the outside of the organic encapsulation layer 320 and contacting the first inorganic encapsulation layer 310 in the peripheral area PA.

During a process of forming the thin-film encapsulation layer, structures under the thin-film encapsulation layer may be damaged. According to an exemplary embodiment of the present disclosure, during a process of forming the first inorganic encapsulation layer 310, a layer right under the first inorganic encapsulation layer 310 may be damaged. Accordingly, to prevent the structure under the thin-film encapsulation layer from being damaged during the process of forming the thin-film encapsulation layer, at least one capping layer and/or at least one protective layer may be arranged between the opposite electrode 251 and the thin-film encapsulation layer. The capping layer and/or the protective layer may include an inorganic material.

A refractive layer 500 may be arranged over the organic light-emitting diode 200, for example, on the encapsulation member 300. The refractive layer 500 may adjust the path of light emitted from the emission layer of the organic light-emitting diode 200 and serve as a condensing lens. The refractive layer 500 may change the path of light progressing in a lateral direction (for example, a direction excluding a third direction (a z-direction)) among light emitted from the emission layer of the organic light-emitting diode 200 to allow the light to progress in the third direction (the z-direction) that is approximately the front direction. The refractive layer 500 may include a first refractive layer 510 and a second refractive layer 520.

The first refractive layer 510 may be arranged to correspond to the second area A2 of the substrate 100 and may include a second opening 510OP that exposes an uppermost surface of the encapsulation member 300 corresponding to the first area A1 of the substrate 100. For example, the first refractive layer 510 may include a plurality of second openings 510OP having a lattice structure. The second opening 510OP of the first refractive layer 510 may be formed by patterning a material constituting the first refractive layer 510 by using a photo-etching process. The second opening 510OP of the first refractive layer 510 may at least partially surround the first opening 117OP of the pixel-defining layer 117 and may at least partially overlap the first opening 117OP of the pixel-defining layer 117. The second opening 510OP of the first refractive layer 510 may be greater than the first opening 117OP of the pixel-defining layer 117. The shape of the second opening 510OP of the first refractive layer 510 may be the same as the shape of the first opening 117OP of the pixel-defining layer 117.

In an exemplary embodiment of the present disclosure, the second openings 510OP of the first refractive layer 510 may correspond to a plurality of display elements thereunder, for example, the plurality of organic light-emitting diodes 200.

The first refractive layer 510 may have a first refractive index. In an exemplary embodiment of the present disclosure, the first refractive index of the first refractive layer 510 may be about 1.3 to about 1.5, about 1.3 to about 1.6, or about 1.3 to about 1.4. Various modifications may be made.

The first refractive layer 510 may include a light transmissive inorganic or organic material having a low refractive index. According to an exemplary embodiment of the present disclosure, the inorganic material may include silicon oxide and magnesium fluoride. The organic material may include acryl, polyimide, polyamide, and/or tris (8-hydroxyquinolinato)aluminum (Alq3).

The second refractive layer 520 may at least partially fill the second openings 510OP of the first refractive layer 510 and be arranged on the first refractive layer 510. According to an exemplary embodiment of the present disclosure, the second refractive layer 520 may at least partially cover the first refractive layer 510. The second refractive layer 520 may cover the entire top surface of the substrate 100 and the top surface of the second refractive layer 520 may be approximately flat. The second refractive layer 520 may be formed through an inkjet process or a deposition process.

The second refractive layer 520 may include a light transmissive inorganic or organic material having a high refractive index. In an exemplary embodiment of the present disclosure, the second refractive layer 520 may include high refractive particles 530 dispersed in the second refractive layer 520. The high refractive particles 530 may include zinc oxide, titanium oxide, niobium oxide tantalum oxide, tin oxide, nickel oxide, silicon nitride, indium nitride, and/or gallium nitride. According to an exemplary embodiment of the present disclosure, the high refractive particles 530 may include zirconium oxide.

As used herein, a "high refractive index" is understood to be a refractive index of 1.5 or greater and "high refractive particles" are understood to be particles having a refractive index of 1.5 or greater.

In an exemplary embodiment of the present disclosure, the high refractive particles 530 may be spherical or amorphous and dispersed in the second refractive layer 520. In the case where the high refractive particles 530 are dispersed in the second refractive layer 520, the average diameter of the high refractive particles 530 may be about 5 nm to about 30 nm.

Since the second refractive layer 520 includes the high refractive particles 530 dispersed therein, the second refractive layer 520 may have a second refractive index greater than the first refractive index of the first refractive layer 510. The second refractive index of the second refractive layer 520 may be about 1.6 to about 1.8, about 1.6 to about 1.9, or about 1.6 to about 2. Various modifications may be made. In an exemplary embodiment of the present disclosure, the first refractive layer 510 and the second refractive layer 520 may have a refractive index difference ranging from about 0.1 to about 0.3.

The second refractive layer 520 may include a first layer 521 and a second layer 522, the first layer 521 including the high refractive particles 530 dispersed at a first concentration, and the second layer 522 including the high refractive particles 530 dispersed at a second concentration different from the first concentration. This is described in more detail with reference to FIG. 10.

In an exemplary embodiment of the present disclosure, the second refractive layer 520 may include scattering particles capable of scattering light applied thereto. The scattering particles may have a nano size. According to an exemplary embodiment of the present disclosure, the diameter of the scattering particles may be in the range between about 50 nm and about 1000 nm. In an exemplary embodiment of the present disclosure, the scattering particles may include inorganic particles. According to an exemplary embodiment of the present disclosure, the scattering particles may include silica, $ZrO_2$, $TiO_2$, $Al_2O_3$, $In_2O_3$, ZnO, $SnO_2$, and $Sb_2O_3$. In an exemplary embodiment of the present disclosure, the scattering particles may include organic particles. According to an exemplary embodiment of the present disclosure, the scattering particles may include polystyrene, polymethylmethacrylate (PMMA), acryl-styrene co-polymer, melamine, and polycarbonate. The scattering particles may include one kind or include one or more kinds. Since the second refractive layer 520 includes scattering particles, the color shift between light emitted at various angles may be reduced.

Figure 9:
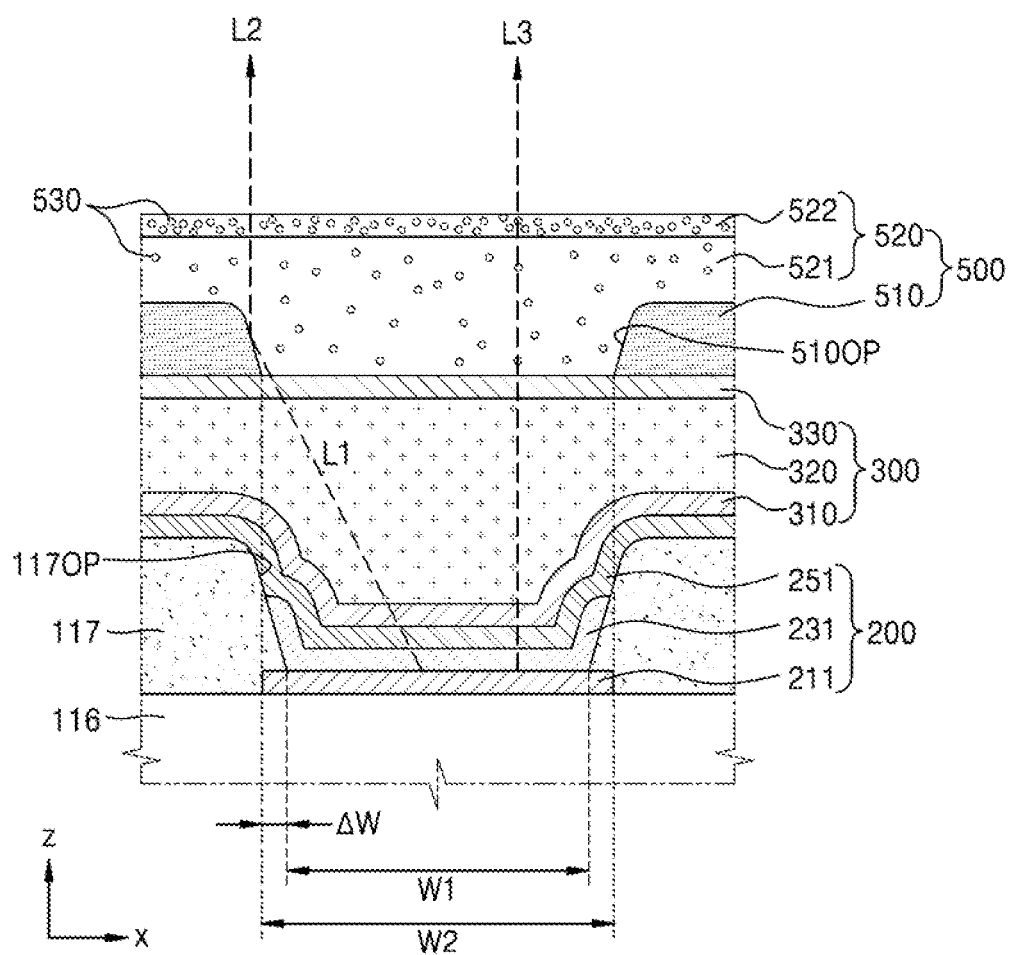
FIG. 9 is a cross-sectional view illustrating a display apparatus according to an exemplary embodiment of the present disclosure.

FIG. 9 is a cross-sectional view illustrating the display apparatus 1 according to an exemplary embodiment of the present disclosure. For example, FIG. 9 is a illustrating light extraction of the refractive layer 500 according to an exemplary embodiment of the present disclosure.

Referring to FIG. 9, the organic light-emitting diode 200 may be arranged on an insulating surface. According to an exemplary embodiment of the present disclosure, the organic light-emitting diode 200 may be arranged on the second planarization layer 116.

A second width W2 of the bottom surface of the second opening 510OP may be greater than a first width W1 of the bottom surface of the first opening 117OP. Here, the width may be a maximum width of the bottom surface. A difference ΔW between the second width W2 and the first width W1 may be different for each pixel. According to an exemplary embodiment of the present disclosure, a difference ΔW between the second width W2 and the first width W1 in the third pixel PX3 may be greater than a difference ΔW between the second width W2 and the first width W1 in the first pixel PX1, and less than a difference ΔW between the second width W2 and the first width W1 in the second pixel PX2. Though it is shown in FIG. 9 that the second width W2 of the second opening 510OP is the same as the width of the pixel electrode 211, the second width W2 of the second opening 510OP may be less than the width of the pixel electrode 211 in an exemplary embodiment of the present disclosure.

Light emitted from the organic light-emitting diode 200 may include light L1 and light L2, the light L1 being obliquely incident toward the lateral surface of the first refractive layer 510, and the light L2 passing through the second refractive layer 520 and being extracted in an approximately third direction (the z-direction) without a direction change Among them, the light L1 incident to the inclined lateral surface of the first refractive layer 510 is totally reflected by an interface between the first refractive layer 510 and the second refractive layer 520 and thus a light path is changed, and total-reflected light L2 may be extracted in the approximately third direction (the z-direction). Accordingly, an emission pattern area of a pixel generated in a front virtual region may be widened. A front light extraction efficiency may be increased by the total reflection at the interface between the first refractive layer 510 having the first refractive index and the second refractive layer 520 having the second refractive index greater than the first refractive index. Accordingly, front visibility may be increased.

Figure 10:
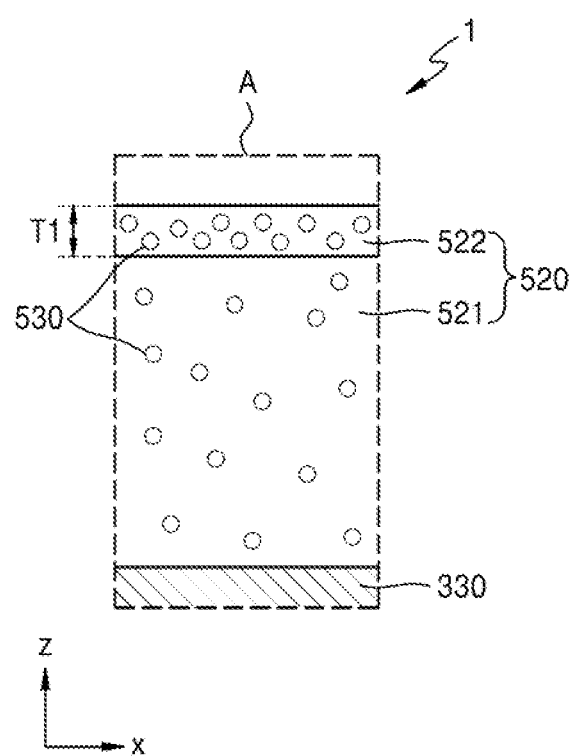
FIG. 10 is a cross-sectional view illustrating a display apparatus according to an exemplary embodiment of the present disclosure.

FIG. 10 is a cross-sectional view illustrating the display apparatus 1 according to an exemplary embodiment of the present disclosure. For example, FIG. 10 corresponds to an enlarged view illustrating a region A of FIG. 8.

Referring to FIGS. 8 and 10, the refractive layer 500 may include the first refractive layer 510 and the second refractive layer 520. The second refractive layer 520 may include the first layer 521 and the second layer 522, the first layer 521 including the high refractive particles 530 dispersed at the first concentration, and the second layer 522 including the high refractive particles 530 dispersed at the second concentration different from the first concentration. In an exemplary embodiment of the present disclosure, the first layer 521 including the high refractive particles 530 dispersed at the first concentration (the z-direction) may be arranged in the bottom portion of the second refractive layer 520, in the third direction, and the second layer 522 including the high refractive particles 530 dispersed at the second concentration different from the first concentration mays be arranged in the top portion of the second refractive layer 520, In this case, the second concentration may be greater than the first concentration. In this example, the first layer 521 of the second refractive layer 520 may be referred to as a second refractive layer while the second layer 522 of the second refractive layer 520 may be referred to as a third refractive layer. Because the second layer 522 of the second refractive layer 521 (which may be referred to as the third refractive layer) has a higher concentration of high refractive particles 530, it may be understood that this layer has a higher refractive index than the first layer 521 of the second refractive layer 520 (which may be referred to as the second refractive layer).

In an exemplary embodiment of the present disclosure, the first layer 521 including the high refractive particles 530 dispersed at the first concentration (the z-direction) may be arranged in the top portion of the second refractive layer 520, in the third direction, the second layer 522 including the high refractive particles 530 dispersed at the second concentration different from the first concentration may be arranged in the bottom portion of the second refractive layer 520. In this case, the second concentration may be greater than the first concentration.

In an exemplary embodiment of the present disclosure, the second concentration of the high refractive particles 530 dispersed in the second layer 522 may be about 75 wt % to about 95 wt %, about 80 wt % to about 95 wt %, or about 75 wt % to about 90 wt %. Various modifications may be made. According to an exemplary embodiment of the present disclosure, the second concentration of the high refractive particles 530 dispersed in the second layer 522 may be about 80 wt % to about 90 wt %. In addition, the first concentration of the high refractive particles 530 dispersed in the first layer 521 may be about 45 wt % to about 75 wt %, about 45 wt % to about 70 wt %, or about 50 wt % to about 75 wt %. Various modifications may be made. According to an exemplary embodiment of the present disclosure, the first concentration of the high refractive particles 530 dispersed in the first layer 521 may be about 50 wt % to about 70 wt %. The second concentration of the high refractive particles 530 dispersed in the second layer 522 may be greater than the first concentration of the high refractive particles 530 dispersed in the first layer 521.

In the case where the thickness of the second layer 522 of the second refractive layer 520 is thin or thick, a light-emitting efficiency may be reduced. Therefore, in an exemplary embodiment of the present disclosure, the second layer 522 including the high refractive particles 530 dispersed at a high concentration may have a first thickness T1 from the top surface of the first layer 521. In this case, the first thickness T1 may be about 0.5 μm to about 1 μm, about 0.6 μm to about 1 μm, or about 0.7 μm to about 1 μm. Various modifications may be made. According to an exemplary embodiment of the present disclosure, the first thickness T1 may be about 0.8 μm to about 1 μm.

Figure 11:
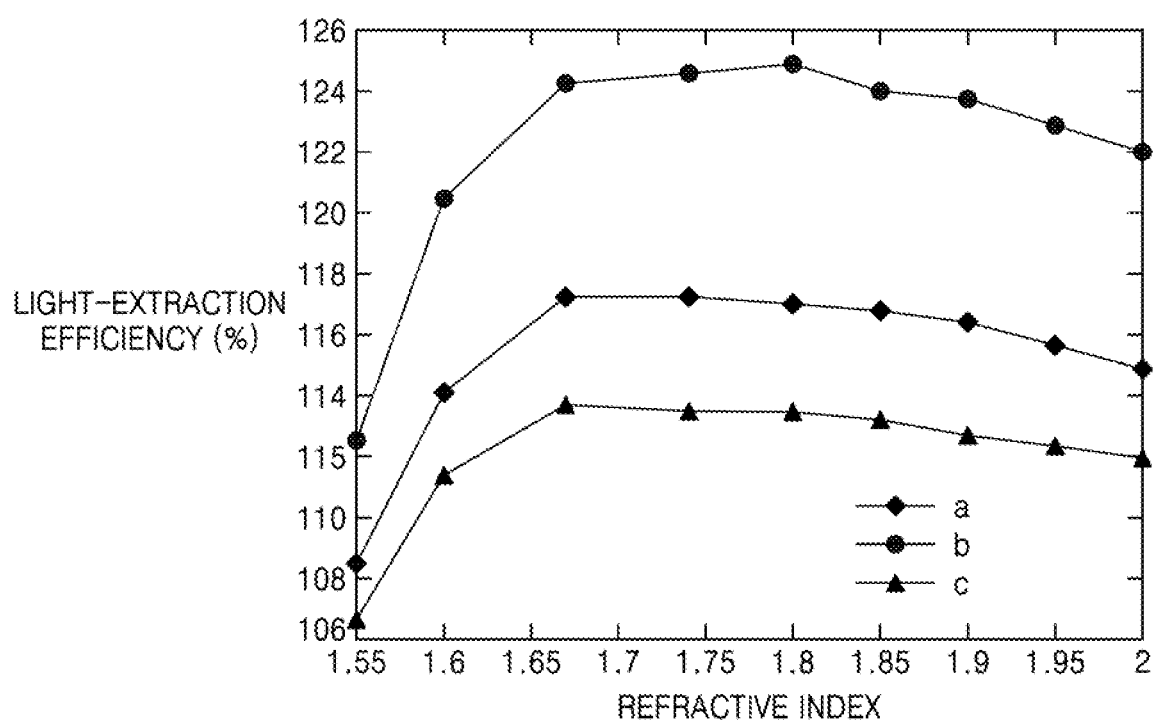
FIG. 11 is a graph illustrating a light-emitting efficiency depending on a refractive index of a second refractive layer.

FIG. 11 is a graph showing a light-emitting efficiency depending on a refractive index of the second refractive layer 520. For example, FIG. 11 is a graph showing a light-emitting efficiency depending on a refractive index of the second refractive layer 520 in a structure in which the refractive layer 500 includes the first refractive layer 510 and the second refractive layer 520, and the second refractive layer 520 includes the first layer 521 and the second layer 522, the first layer 521 including the high refractive particles 530 dispersed at a concentration of about 50 wt % to about 70 wt %, and the second layer 522 including the high refractive particles 530 dispersed at a concentration of about 80 wt % to about 90 wt %. In this case, the thickness of the second layer 522 may be about 0.5 μm to about 1 μm.

In FIG. 11, "a" corresponds to a light-emitting efficiency depending on a refractive index in the case of red light, "b" corresponds to a light-emitting efficiency depending on a refractive index in the case of green light, and "c" corresponds to a light-emitting efficiency depending on a refractive index in the case of blue light. In addition, a light-emitting efficiency means an efficiency of a structure including the refractive layer compared to a structure not including the refractive layer.

Referring to FIG. 11, in the case where the refractive index of the second refractive layer 520 has a value ranging from about 1.55 to about 2, it is known that light-emitting efficiencies of all of red light, green light, and blue light exceeds about 100%. Particularly, in the case where the refractive index of the second refractive layer 520 has a value ranging from about 1.6 to about 1.95, it is known that light-emitting efficiencies of all of red light, green light, and blue light exceeds about 110%.

Generally, in the case where a light-emitting efficiency exceeds about 110%, it may be considered that a light-emitting efficiency has increased. Therefore, in the display apparatus 1, according to an exemplary embodiment of the present disclosure, in the case where the refractive layer 500 includes the first refractive layer 510 and the second refractive layer 520, and the second refractive layer 520 includes the first layer 521 and the second layer 522, the first layer 521 including the high refractive particles 530 dispersed at a concentration of about 50 wt % to about 70 wt %, and the second layer 522 including the high refractive particles 530 dispersed at a concentration of about 80 wt % to about 90 wt %, the light-emitting efficiency of the display apparatus 1 may be increased.

Figure 12:
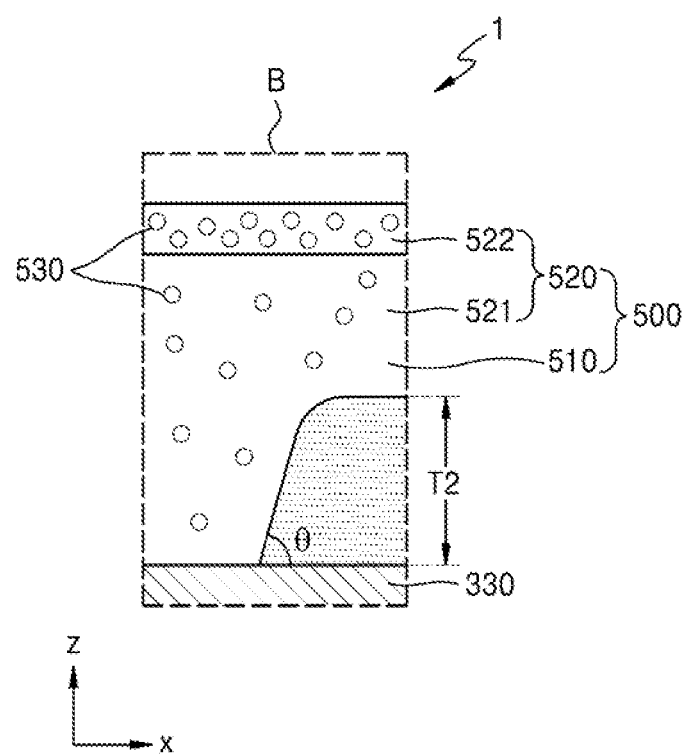
FIG. 12 is a cross-sectional view illustrating a display apparatus according to an exemplary embodiment of the present disclosure.

FIG. 12 is a cross-sectional view illustrating the display apparatus 1 according to an exemplary embodiment of the present disclosure. For example, FIG. 12 corresponds to an enlarged view illustrating a region B of FIG. 8.

Referring to FIG. 12, as described above with reference to FIG. 9, for total reflection of the light L1 incident to the first refractive layer 510 to occur at the interface between the first refractive layer 510 and the second refractive layer 520, an incident angle of the light L1 incident to the first refractive layer 510 should be greater than a critical angle. For this purpose, the lateral surface of the first refractive layer 510 may have a slope θ of about 70°. The first refractive layer 510 may be formed by patterning a material constituting the first refractive layer 510 on the encapsulation member 300 through a photo-etching process. To allow the inner wall of the second opening 510OP to have a slope θ of about 70° after the photo-etching process, the first refractive layer 510 may have a thickness T2 of about 1.5 μm to about 2.5 μm.

Figure 13:
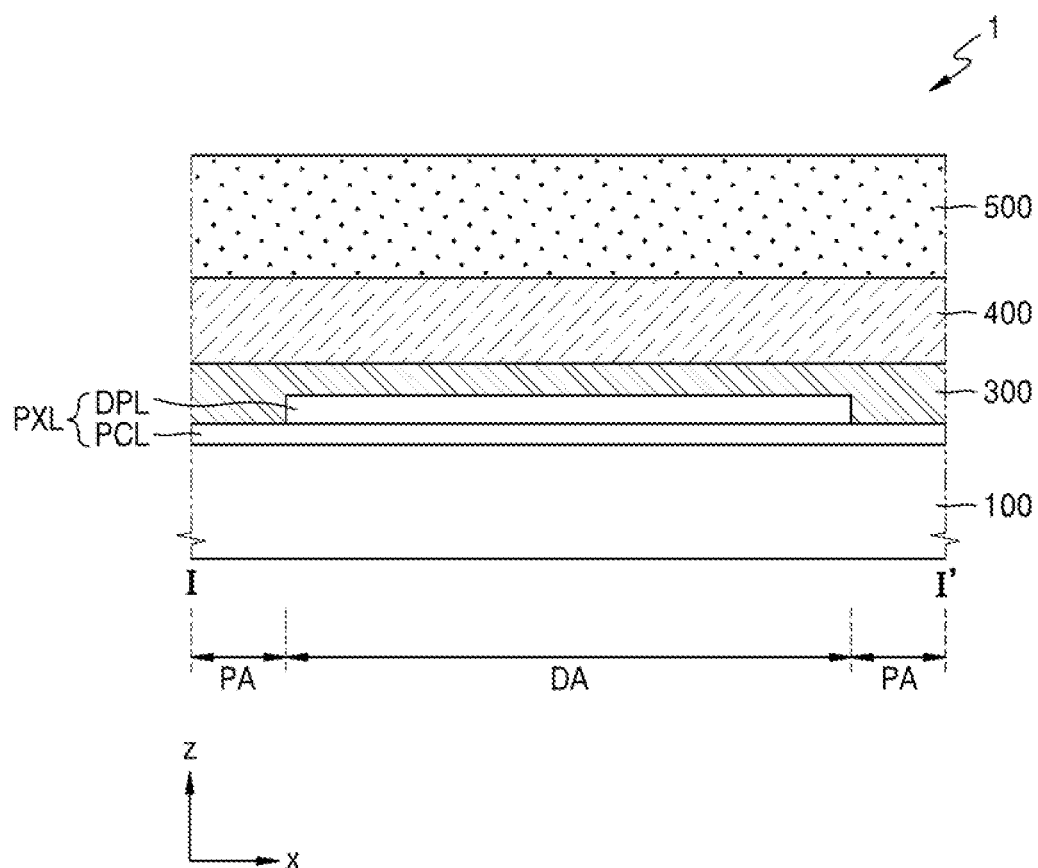
FIGS. 13 and 14 are cross-sectional views illustrating a display apparatus according to an exemplary embodiment of the present disclosure.
Figure 14:
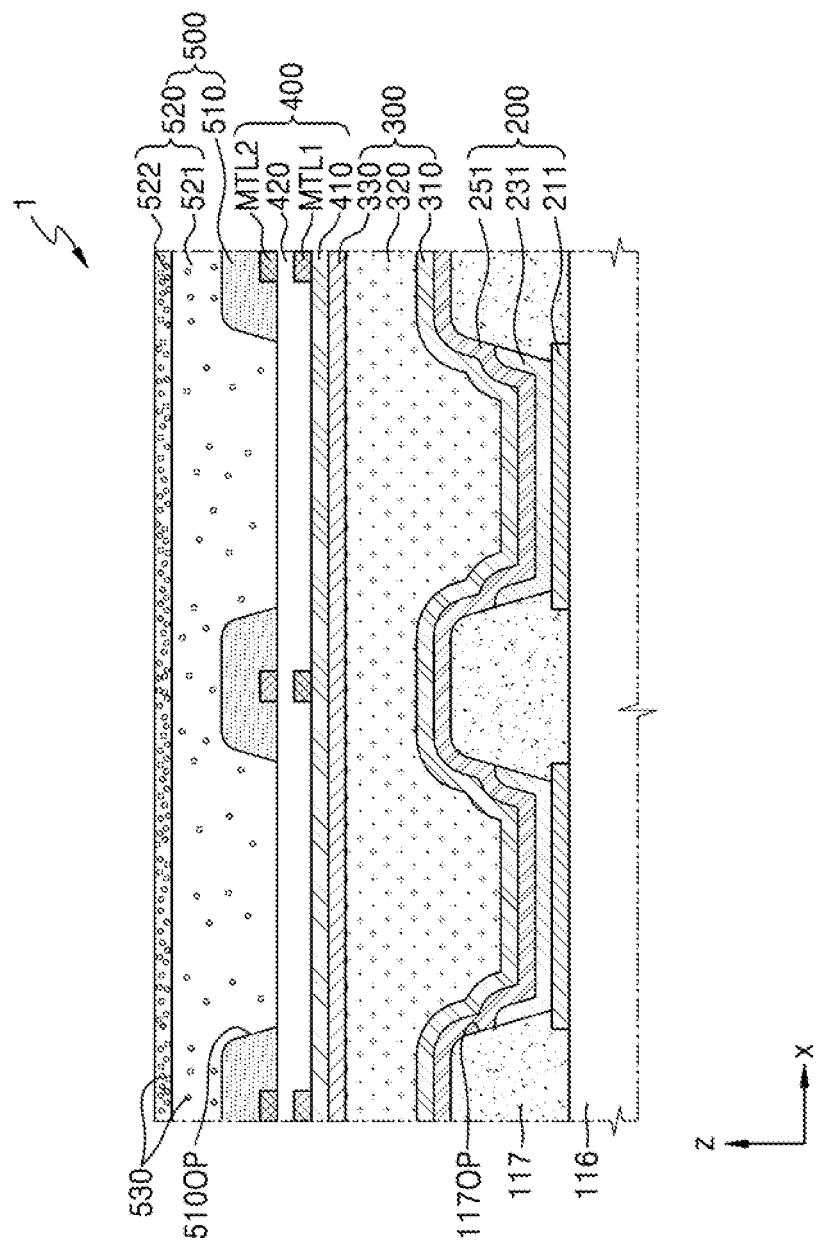

FIGS. 13 and 14 are cross-sectional views of the display apparatus 1 according to an exemplary embodiment of the present disclosure. Referring to FIGS. 13 and 14, the structures of the substrate 100, the pixel layer PXL, the encapsulation member 300, and the refractive layer 500 are the same as those described above with reference to FIGS. 2 and 8. Hereinafter, descriptions of the same configurations as those described above are omitted and to the extent that descriptions of elements have been omitted, it may be assumed that those elements are at least similar to corresponding elements that have been described elsewhere in the present disclosure.

In an exemplary embodiment of the present disclosure, the display apparatus 1 may further include an input sensing layer 400 arranged between the encapsulation member 300 and the refractive layer 500.

The input sensing layer 400 may sense an external touch and obtain coordinate information therefrom, for example, a touch event of an object such as a finger or a stylus pen. The input sensing layer 400 may include a sensing electrode and/or a trace line. The input sensing layer 400 may sense an external input through a mutual capacitive method or a self-capacitive method.

The input sensing layer 400 may include a first conductive layer MTL1 and a second conductive layer MTL2 each including a sensing electrode and/or a trace line. A first touch insulating layer 410 may be arranged between the encapsulation member 300 and the first conductive layer MTL1. A second touch insulating layer 420 may be arranged between the first conductive layer MTL1 and the second conductive layer MTL2.

The first conductive layer MTL1 and the second conductive layer MTL2 each may include a conductive material. The conductive material may include molybdenum (Mo), aluminum (Al), copper (Cu), and titanium (Ti) and may include a single layer or a multi-layer including the above materials. In an exemplary embodiment of the present disclosure, the first conductive layer MTL1 and the second conductive layer MTL2 each may have a structure of a Ti layer/an Al layer/a Ti layer that are sequentially stacked.

The first touch insulating layer 410 and the second touch insulating layer 420 each may include an inorganic insulating material and/or an organic insulating material. The inorganic insulating material may include silicon oxide, silicon oxynitride, and silicon nitride. The organic insulating material may include an acryl-based organic material and an imide-based organic material.

The first refractive layer 510 of the refractive layer 500 may be arranged on the second conductive layer MTL2 and the second touch insulating layer 420. The first refractive layer 510 may include a protective layer that passivates a conductive layer of the input sensing layer 400, for example, the second conductive layer MTL2. Accordingly, the second conductive layer MTL2 may at least partially overlap the first refractive layer 510 of the refractive layer 500.

The first refractive layer 510 may be arranged to correspond to the second area A2 of the substrate 100 and may include the second opening 510OP that exposes the uppermost surface of the second touch insulating layer 420 of the input sensing layer 400 corresponding to the first area A1 of the substrate 100. The second opening 510OP of the first refractive layer 510 may be formed by patterning a material constituting the first refractive layer 510 on the input sensing layer 400 by using a photo-etching process.

In the case where the display apparatus 1 includes the input sensing layer 400, the first refractive layer 510 may have a thickness of about 1.5 μm to about 2.5 μm from the top surface of the second touch insulating layer 420.

The second refractive layer 520 may at least partially fill the second opening 510OP of the first refractive layer 510 and be arranged on the first refractive layer 510. According to an exemplary embodiment of the present disclosure, the second refractive layer 520 may at least partially cover the first refractive layer 510. The second refractive layer 520 may cover the entire top surface of the substrate 100. The top surface may be approximately flat. The second refractive layer 520 may be formed through an inkjet process or a deposition process.

At least a portion of the second refractive layer 520 may be arranged in the second opening 510OP that exposes the uppermost surface of the second touch insulating layer 420 of the input sensing layer 400. According to an exemplary embodiment of the present disclosure, at least a portion of the second refractive layer 520 may be directly arranged on the second touch insulating layer 420 of the input sensing layer 400.

Figure 15:
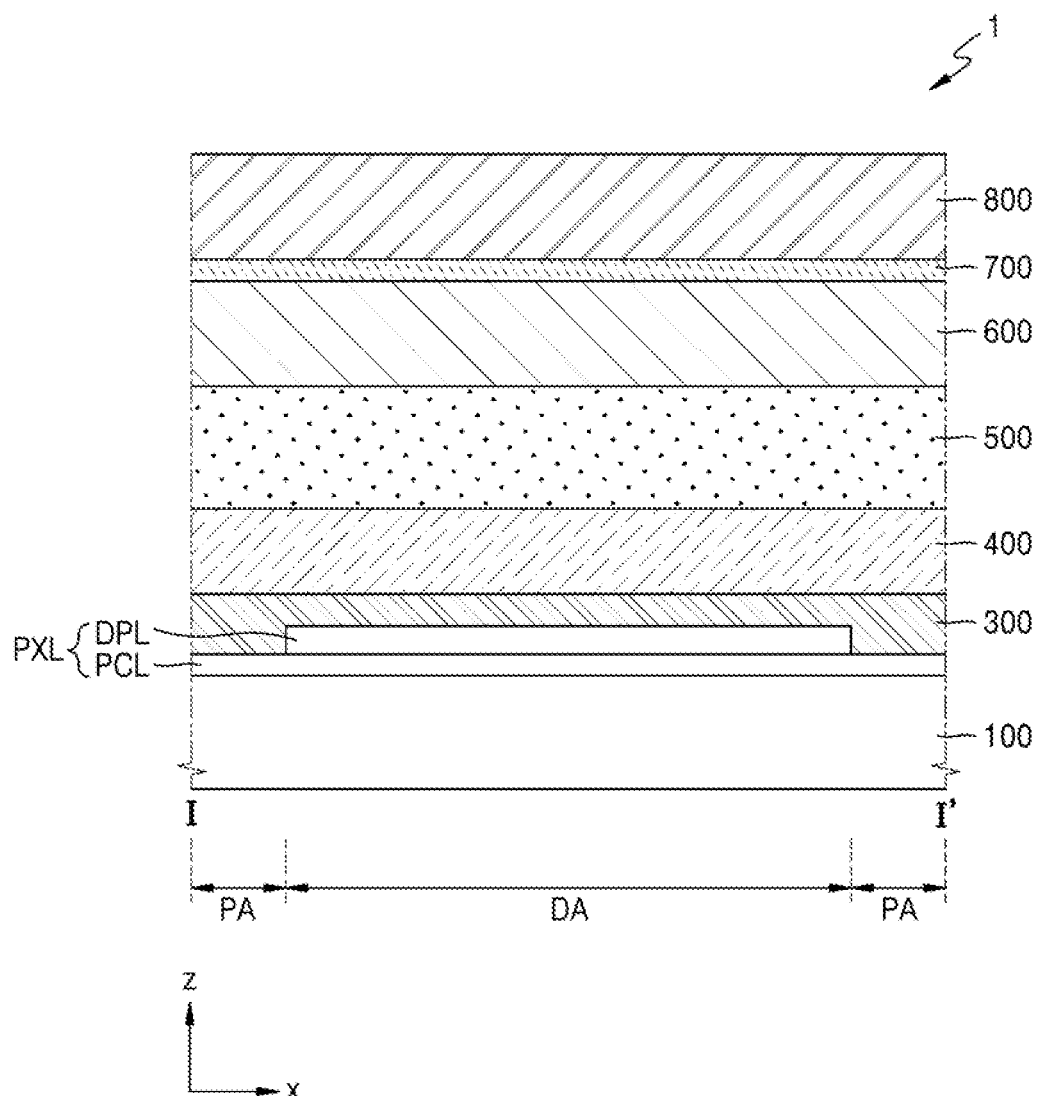
FIGS. 15 and 16 are cross-sectional views illustrating a display apparatus according to an exemplary embodiment of the present disclosure.
Figure 16:
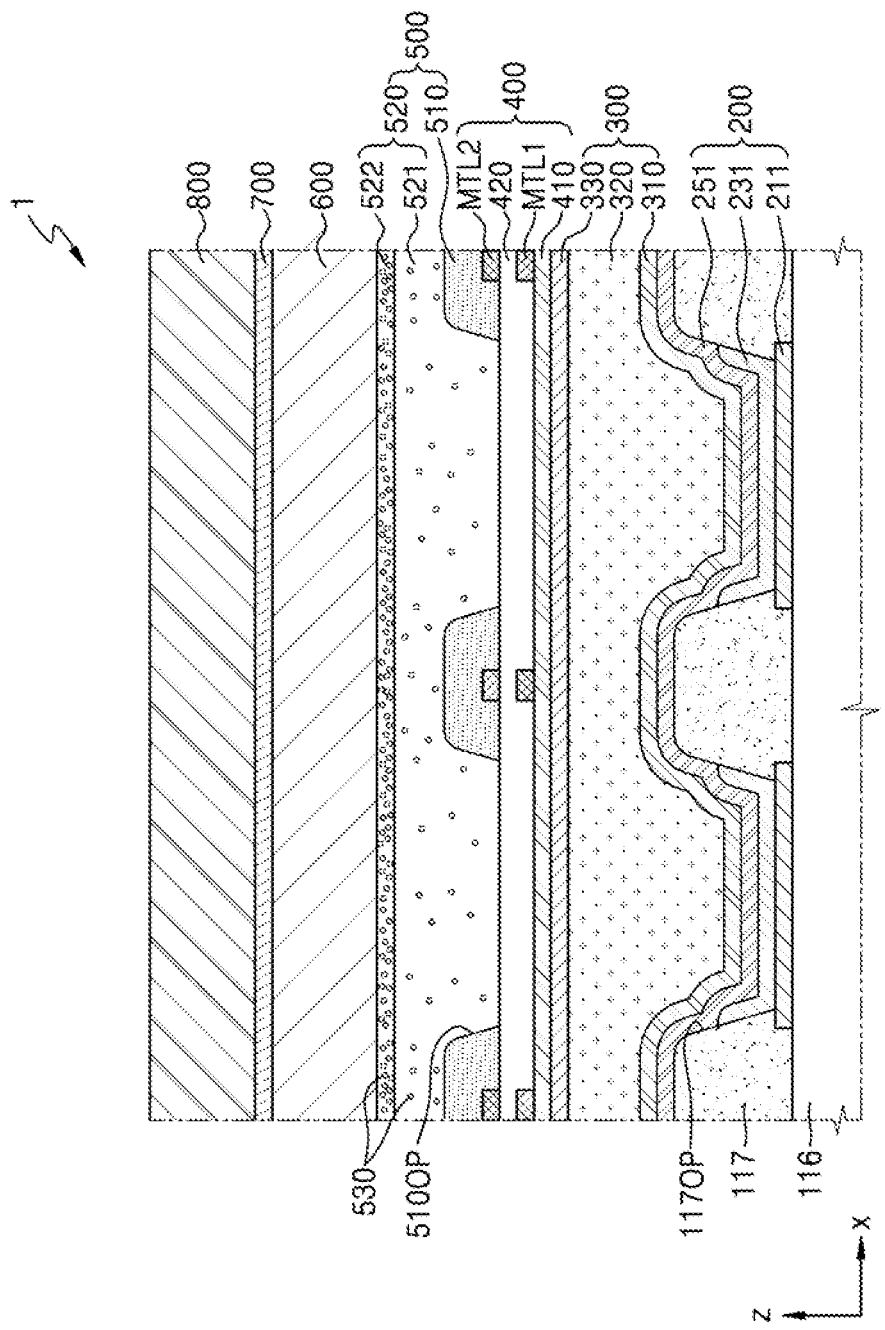

FIGS. 15 and 16 are cross-sectional views of the display apparatus 1 according to an exemplary embodiment of the present disclosure. Referring to FIGS. 15 and 16, the structures of the substrate 100, the pixel layer PXL, the encapsulation member 300, the input sensing layer 400, and the refractive layer 500 are the same as those described above. Hereinafter, descriptions of the same configurations as those described above are omitted.

In an exemplary embodiment of the present disclosure, the display apparatus 1 may further include a polarizing layer 600, an adhesive layer 700, and a window 800 sequentially arranged on the refractive layer 500.

The polarizing layer 600 may transmit only light that has the same polarization axis among light emitted from the display element of the display element layer DPL and absorb or reflect light is polarized in other directions. The polarizing layer 600 may include a retarder and/or a polarizer. In addition, the polarizing layer 600 may include a black matrix and/or color filters. The refractive layer 500 and the polarizing layer 600 may be attached through an adhesive such as an optically clear adhesive OCA.

The window 800 may be arranged over the polarizing layer 600. The adhesive layer 700 may be arranged therebetween.

The display apparatus 1, according to exemplary embodiments of the present disclosure, includes a refractive layer including a low refractive layer and a high refractive layer to increase the efficiency of light extracted to the front of the display apparatus 1. In an exemplary embodiment of the present disclosure, the refractive layer may include a low refractive layer and a high refractive layer. The high refractive layer may include a first layer and a second layer, the first layer including high refractive particles dispersed at a concentration of about 50 wt % to about 70 wt %, and the second layer including the high refractive particles dispersed at a concentration of about 80 wt % to about 90 wt %. Accordingly, the efficiency of light extracted to the front of the display apparatus may be increased.

According to exemplary embodiments of the present disclosure, the light-extraction efficiency of the display apparatus may be increased.

Descriptions of features or aspects within each embodiment should typically be considered as available for other similar features or aspects in other embodiments. Accordingly, all of the features and structures described herein may be mixed and matched in any workable combination without departing from the scope of the present disclosure. While exemplary embodiments of the present disclosure have been described with reference to the figures, it will be understood by those of ordinary skill in the art that various changes in form and details may be made therein without departing from the spirit and scope of the present disclosure.

What is claimed is:

1. A display apparatus, comprising:
a substrate;
a display element disposed on the substrate;
an encapsulation member on the display element; and
a refractive layer disposed on the encapsulation member and including a first refractive layer and a second refractive layer, the first refractive layer including an opening that corresponds to the display element, and the second refractive layer including a plurality of refractive particles,
wherein the second refractive layer includes a first portion and a second portion, the first portion and the second portion each including the plurality of refractive particles, and
wherein an amount of the plurality of refractive particles in the second portion is greater than an amount of the plurality of refractive particles in the first portion.

2. The display apparatus of claim 1, wherein the first refractive layer has a first refractive index and the second refractive layer has a second refractive index,
wherein the second refractive index, is greater than the first refractive index.

3. The display apparatus of claim 1, wherein the first portion is disposed between the second portion and the encapsulation member.

4. The display apparatus of claim 1, wherein the second refractive layer at least partially covers the first refractive layer.

5. The display apparatus of claim 1, wherein an average diameter of each of the plurality of refractive particles is about 5 nm to about 30 nm.

6. The display apparatus of claim 2, wherein the first refractive index of the first refractive layer is about 1.3 to about 1.5.

7. The display apparatus of claim 2, wherein the second refractive index of the second refractive layer is about 1.6 to about 1.9.

8. The display apparatus of claim 1, wherein the second refractive layer is disposed through an inkjet process or a deposition process.

9. The display apparatus of claim 1, wherein an inner wall of the opening includes an inclined surface.

10. The display apparatus of claim 1, wherein a thickness of the first refractive layer is about 1.5 μm to about 2.5 μm.

11. The display apparatus of claim 1, further comprising an input sensing layer disposed between the encapsulation member and the refractive layer and including an insulating layer and at least one conductive layer, the at least one conductive layer including a sensing electrode or a trace line.

12. The display apparatus of claim 11, wherein the first refractive layer at least partially overlaps the at least one conductive layer of the input sensing layer.

13. The display apparatus of claim 1, further comprising a polarizing layer disposed on the refractive layer.

14. A display apparatus, comprising:
a substrate;
a display element disposed on the substrate;
an encapsulation member on the display element; and
a refractive layer disposed on the encapsulation member and including a first refractive layer, a second refractive layer, and a third refractive layer,
wherein a refractive index of the second refractive layer is greater than a refractive index of the first refractive layer, and a refractive index of the third refractive layer is greater than the refractive index of the second refractive layer.

15. The display apparatus of claim 14, wherein the first refractive layer includes an opening that corresponds to the display element.

16. The display apparatus of claim 14, wherein the refractive index of the second refractive layer is greater than the refractive index of the first refractive layer.

17. The display apparatus of claim 16, wherein the refractive index of the first refractive layer is about 1.3 to about 1.5.

18. The display apparatus of claim 16, wherein the refractive index of the second refractive layer is greater than 1.6.

19. The display apparatus of claim 14, wherein the second refractive layer and the third refractive layer each include a plurality of refractive particles.

20. The display apparatus of claim 19, wherein an amount of the plurality of refractive particles in the third refractive layer is greater than an amount of the plurality of refractive particles in the second refractive layer.

* * * * *